(12) United States Patent
Diefenbeck (10) Patent No.: US 8,563,387 B2
(45) Date of Patent: Oct. 22, 2013

(54) TRANSISTOR AND METHOD OF MANUFACTURING A TRANSISTOR

(75) Inventor: Klaus Diefenbeck, Munich (DE)

(73) Assignee: Infineon Technologies AG, Neubiberg (DE)

( * ) Notice: Subject to any disclaimer, the term of this patent is extended or adjusted under 35 U.S.C. 154(b) by 267 days.

(21) Appl. No.: 12/888,142

(22) Filed: Sep. 22, 2010

(65) Prior Publication Data

US 2012/0068309 A1 Mar. 22, 2012

(51) Int. Cl.
*H01L 21/8222* (2006.01)

(52) U.S. Cl.
USPC ..................... 438/369; 257/E21.37

(58) Field of Classification Search
None
See application file for complete search history.

(56) References Cited

U.S. PATENT DOCUMENTS

| | | | | |
|---|---|---|---|---|
| 4,500,900 A | * | 2/1985 | Shimizu | 257/580 |
| 5,521,410 A | * | 5/1996 | Yamamoto | 257/342 |
| 2004/0079991 A1 | * | 4/2004 | Lin et al. | 257/335 |

* cited by examiner

*Primary Examiner* — Michael Lebentritt
*Assistant Examiner* — Kevin Quinto
(74) *Attorney, Agent, or Firm* — Slater & Matsil, L.L.P.

(57) ABSTRACT

In accordance with an embodiment of the present invention a transistor is disclosed. The transistor comprises a collector, a base and an emitter, wherein a first end width of the base is larger than a middle width of the base, wherein a first end width of the collector is larger than a middle width of the collector, or wherein a first end width of the emitter is larger than a middle width of the emitter.

24 Claims, 8 Drawing Sheets

TRANSISTOR AND METHOD OF MANUFACTURING A TRANSISTOR

TECHNICAL FIELD

The present invention relates generally to transistors and methods for manufacturing a transistor.

BACKGROUND

Transistors are an example of an electronic component that has continued to evolve in both usability and applications even as technology has advanced. Currently, there are dozens of different types of transistors that are in common use in a number of appliances and in many types of machinery and devices that are utilized in all forms of business.

The two main categories are bipolar junction transistors (BJT) and field effect transistors (FETs). A bipolar junction transistor may have three terminals: an emitter, a base and a collector. The field effect transistor may have four terminals: a source, a gate, a drain and a body (substrate). There are several types of bipolar junction transistors. For example, bipolar junction transistors (BJT) may be avalanche transistor, insulated gate bipolar transistors (IGBTs) and photo transistors. There are several types of field effect transistors (FET). For example, field effect transistors (FETs) may be metal semiconductor field effect transistors (MESFETs), metal oxide field effect transistors (MOSFETs) or fin field effect transistors (FinFETs).

SUMMARY OF THE INVENTION

In accordance with an embodiment of the present invention a transistor is disclosed. The transistor comprises a collector, a base and an emitter, wherein a first end width of the base is larger than a middle width of the base, wherein a first end width of the collector is larger than a middle width of the collector, or wherein a first end width of the emitter is larger than a middle width of the emitter.

In accordance with another embodiment of the present invention, a method for making a transistor comprises forming a semiconductive material layer over a substrate, forming a first photoresist over the semiconductive material layer, the first photoresist comprising a first barbell shaped opening, and forming a first region by implanting dopants from a first conductivity type into the semiconductive material through the opening.

In accordance with another embodiment of the present invention, a method for manufacturing a semiconductor device comprises forming a collector region in a first semiconductive material, forming a base region in a second semiconductive material over the first semiconductive material, and forming an emitter region in the second semiconductive material adjacent the base region, wherein the base region comprises a first end region width and an inner region width, and wherein the first end region width is wider than the inner region width.

In accordance with another embodiment of the present invention, a method for manufacturing a semiconductor device comprises forming a first semiconductive material over a substrate, forming a second semiconductive material over the first semiconductive material, forming an opening in the second semiconductive material, the opening comprising a barbell shape, and implanting dopants into the first semiconductive material using the opening.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely bipolar transistors such as NPN transistors or PNP transistors. The invention may also be applied, however, to field effect transistors (FET) or diodes.

Figure 1:
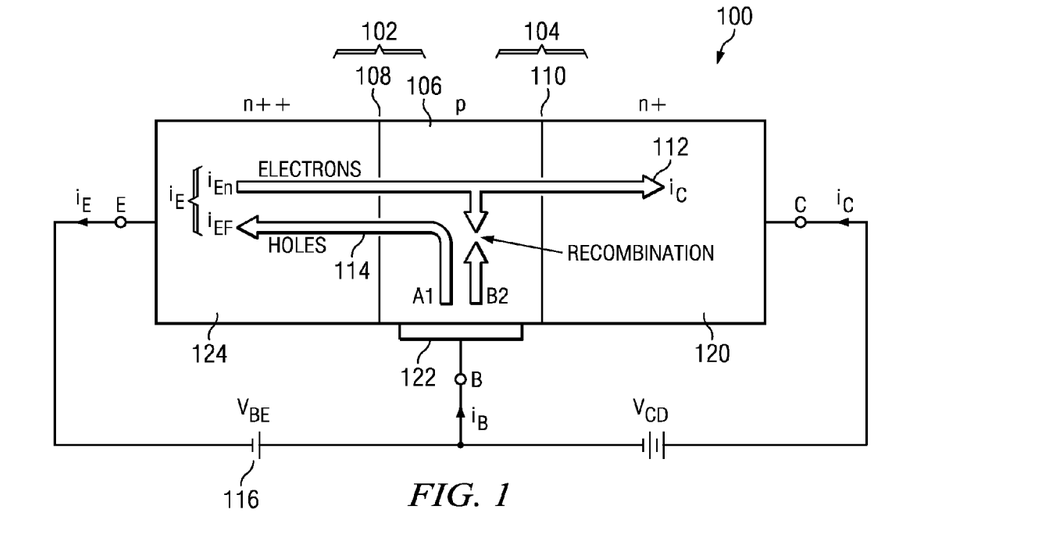
FIG. 1 shows a circuit diagram of a bipolar transistor.

FIG. 1 shows a circuit diagram of an NPN bipolar transistor 100. The NPN bipolar transistor 100 can be considered as two diodes 102, 104 with a shared anode 106. Under typical operation conditions, the base-emitter junction 108 may be forward biased and the base collector junction 110 may be reverse biased. The collector-emitter current 112 may be controlled by the base-emitter current (current control) 114 or by the base-emitter voltage (voltage control) 116. Alternatively, the bipolar transistor 100 may be a PNP bipolar transistor instead of an NPN bipolar transistor with the respective opposite polarities.

Figure 2:
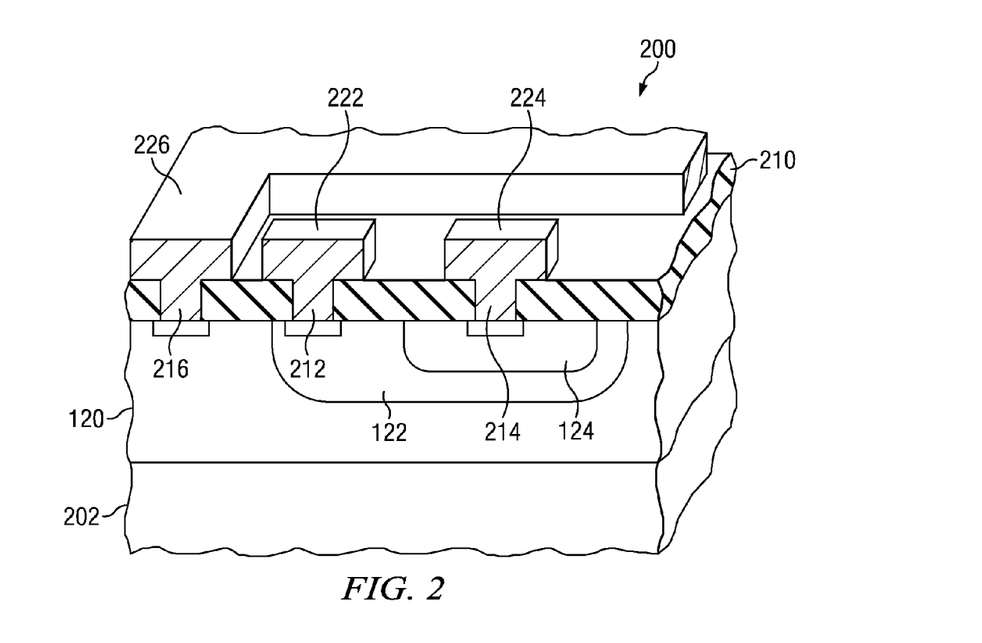
FIG. 2 shows an embodiment of a bipolar transistor.

FIG. 2 shows a view of an embodiment of an NPN bipolar transistor 200. The NPN bipolar transistor 200 comprises a substrate 202. The substrate 202 may be silicon, gallium arsenide (GaAs) or indium phosphorus (InP). A first layer 120 may be formed on the substrate 202. The first layer 120 may be an epitaxial layer and may comprise silicon. The first layer 120 may comprise a dopant from a first conductivity type. A first well 122 may be implanted into the first layer 120. The first well 122 may be formed by implanting a dopant from a second conductive type, opposite to the dopant of the first conductivity type. A second well 124 may be implanted into the first well 122. The second well 124 may be formed by implanting a dopant from a first conductivity type. For example, the first layer 120 may be n type doped, the first well 122 may be p type doped and the second well 124 may be n type doped to form an NPN transistor. The first well 122 may form a base, a part of the first layer 120 may form a collector and the second well 124 may form an emitter of the transistor 200.

An interlayer dielectric 210 may be formed above the substrate 202. The interlayer dielectric 210 comprises one layer or a plurality of layers. The plurality of layers may comprise contact and metal line layers. FIG. 2 may show a simplified interlayer dielectric 210 having contacts 212-216. Contact 212 connects the base 122 to a base terminal 222. Contact 214 connects the emitter 124 to an emitter terminal 224. Contact 216 connects the collector 120 to a collector terminal 226.

In one embodiment the transistor 200 may be a high frequency transistor. High frequency transistors may need large device width. In order to prevent current crowding due to lateral base voltage drop and to achieve a low noise figure, the base resistance $R_B$ should be minimized. A layout practice may be to decompose one transistor with a large device width into a plurality of transistors with smaller device widths. This is achieved by an interdigitated finger structure.

The frequency of transition or transition frequency $f_T$ describes the frequency at which the open loop current gain $h_{fe}$ drops to unity. The transition frequency $f_T$ may substantially determine the noise figure $N_{fmin}$ for high frequencies and may substantially determine the power gain for the complete frequency spectrum.

$BV_{CE0}$ describes the break down voltage between the collector and the emitter while the base is floating. In typical bipolar transistor applications the base may usually not be floating but a high ohmic resistor may be electrically connected to the base and the supply voltage $V_{cc}$. The transition frequency $f_T$ and the $BV_{CE0}$ may depend on the base region and collector region design.

If an electrical break down occurs, the break down may occur at the interface between the base region and the collector region (collector diode). Accordingly, the $BV_{CE0}$ may depend on the break down voltage between collector and base ($BV_{CB0}$) and the current gain. $BV_{CB0}$ in turn depends on the width and the doping of the collector.

One important parameter for high frequency transistors may be the product of transition frequency $f_T$ and the break down voltage $BV_{CE0}$. The product of transition frequency $f_T$ and break down voltage $BV_{CE0}$ may limit the application of a transistor regarding a maximum applicable frequency and a maximum applicable supply voltage $V_{cc}$.

The product of transition frequency $f_T$ and the break down voltage $BV_{CE0}$ may be influenced by the design of the base and the collector regions of a transistor. The product of the transition frequency $f_T$ and the break down voltage $BV_{CE0}$ may be a fixed number for a given technology platform. The two factors may be traded against each other. For example, if the transition frequency $f_T$ goes up the break down voltage $BV_{CE0}$ goes down or if the break down voltage $BV_{CE0}$ goes up the transition frequency $f_T$ goes down. More particular, an additional collector width may improve (increase) the break down voltage $BV_{CE0}$ but may impair (decrease) the transition frequency $f_T$.

In order to increase the product of transition frequency $f_T$ and the break down voltage $BV_{CE0}$ the technology platform and/or the layout may be improved. The higher the product of transition frequency $f_T$ and break down voltage $BV_{CE0}$ is, the more applications may the technology platform support.

Figure 3A:
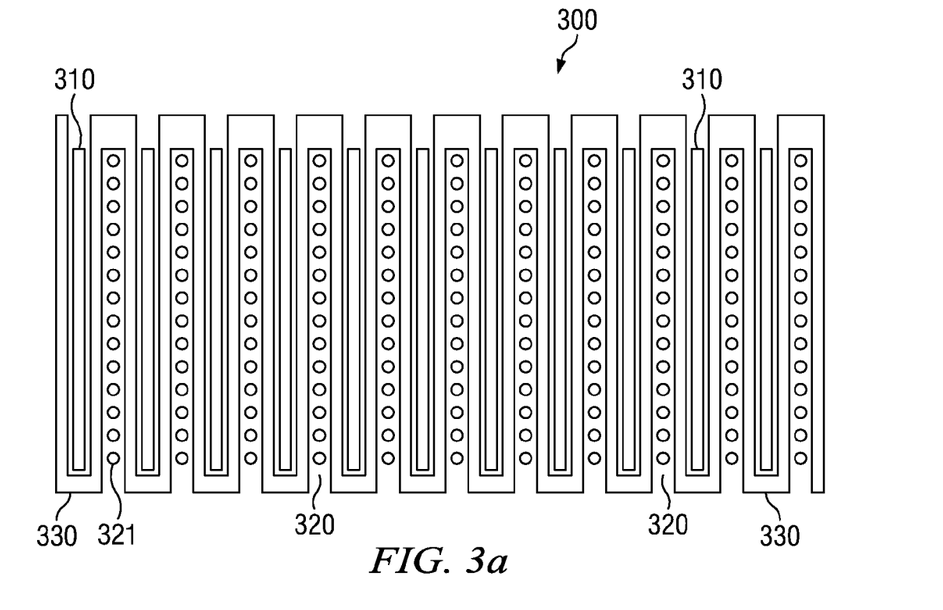
FIG. 3a shows a top view of a contact arrangement of a bipolar transistor.

FIG. 3a shows at top view of a contact arrangement 300. The contact arrangement 300 may comprise a plurality of fingers 310 and a plurality of rows of contacts 320. The fingers 310 may be emitter fingers 310. The fingers 310 may be the emitter contact 214. The rows of contacts 320 may be a row of base contacts 320. A contact 321 may be the base contact 212. Structure 330 may be interlayer dielectric 210 surrounding the emitter fingers 310 and the base contacts 320. Each emitter finger 310 may be surrounded by two rows of base contacts 320. At both ends of the contact arrangement 300 may be a row of contacts 328.

Figure 3B:
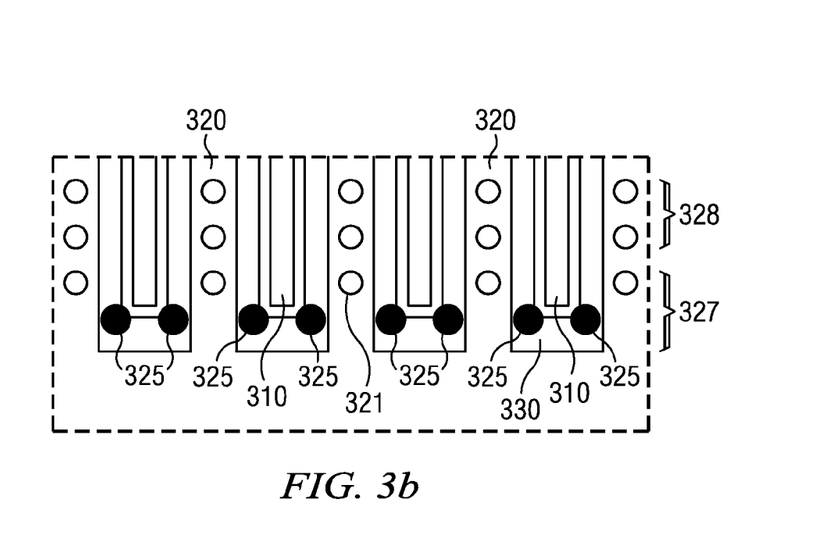
FIG. 3b shows a detail of the top view of the contact arrangement of a bipolar transistor.

FIG. 3b shows a detail of the contact arrangement 300. FIG. 3b shows ends of five emitter fingers 310 and ends of four rows of contacts 320 in a peripheral region 327. FIG. 3b shows the contact arrangement 300 of a transistor 200 while an electrical break down occurs. Regions 325 show the places where the break down occurs. The break down may occur in region 327 next to the end of the emitter fingers 310 and the last contact 321 of a row of contacts 320 inside the transistor 200. In contrast, the break down may not occur in the inner region 328 of the emitter fingers 310 and the rows of contacts 320. As described in more detail below, the break down may occur in the transistor 200 below the contact arrangement 300. For example, the break down may occur at the base 122/collector 120 interface of the transistor 200. The break down may occur in spherical regions of the base 122/collector 120 interface of the transistor 200. The break down may not occur in cylindrical regions of the base 122/collector 120 interface of the transistor 200.

Figure 4:
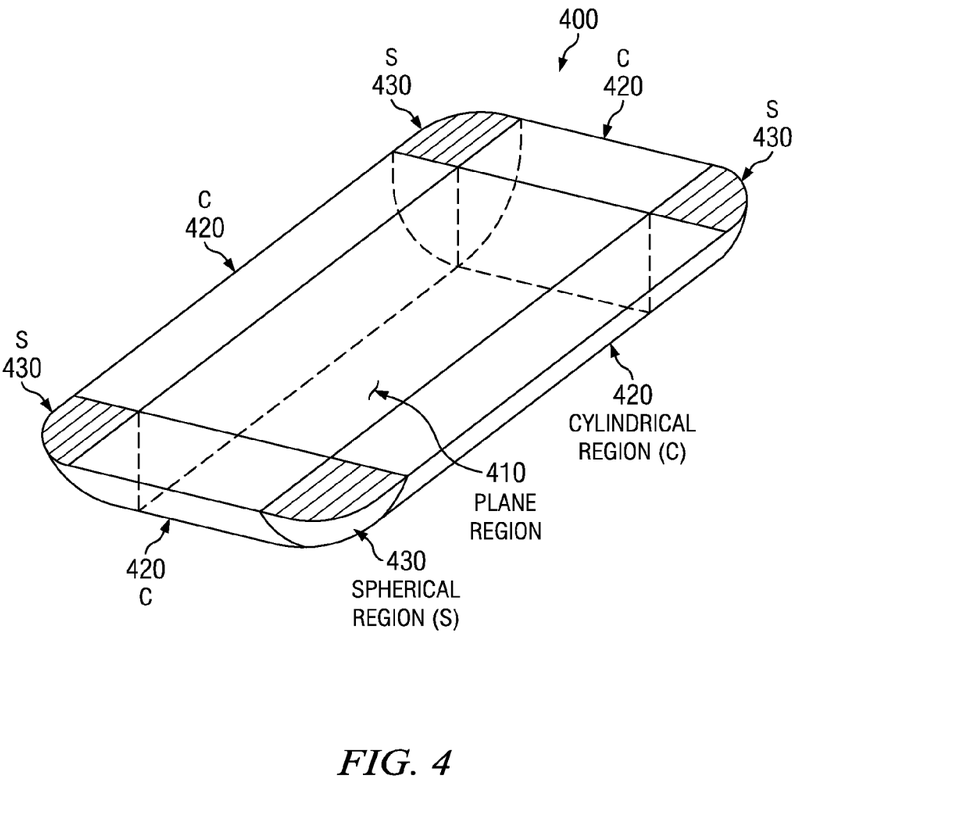
FIG. 4 shows a doping profile of a base region.

FIG. 4 shows a doping profile of a well 400. The doping profile 400 may form a spherical device having plane regions 410 at the top and the bottom, cylindrical regions 420 along the four sides, and spherical regions at the corners 430. The doping profile 400 may be that of the base well 122 in FIG. 2. The area surrounding the spherical device 400 may be the collector in the first layer 120. The doping profile 400 may be formed by implanting dopants in the plane region 410. Dopants may diffuse into adjacent areas, for example, the cylindrical and spherical regions 420, 430 when additional process steps are applied. Implanting dopants into the first layer 120 may form the doping profile of the base well 122.

Figure 5:
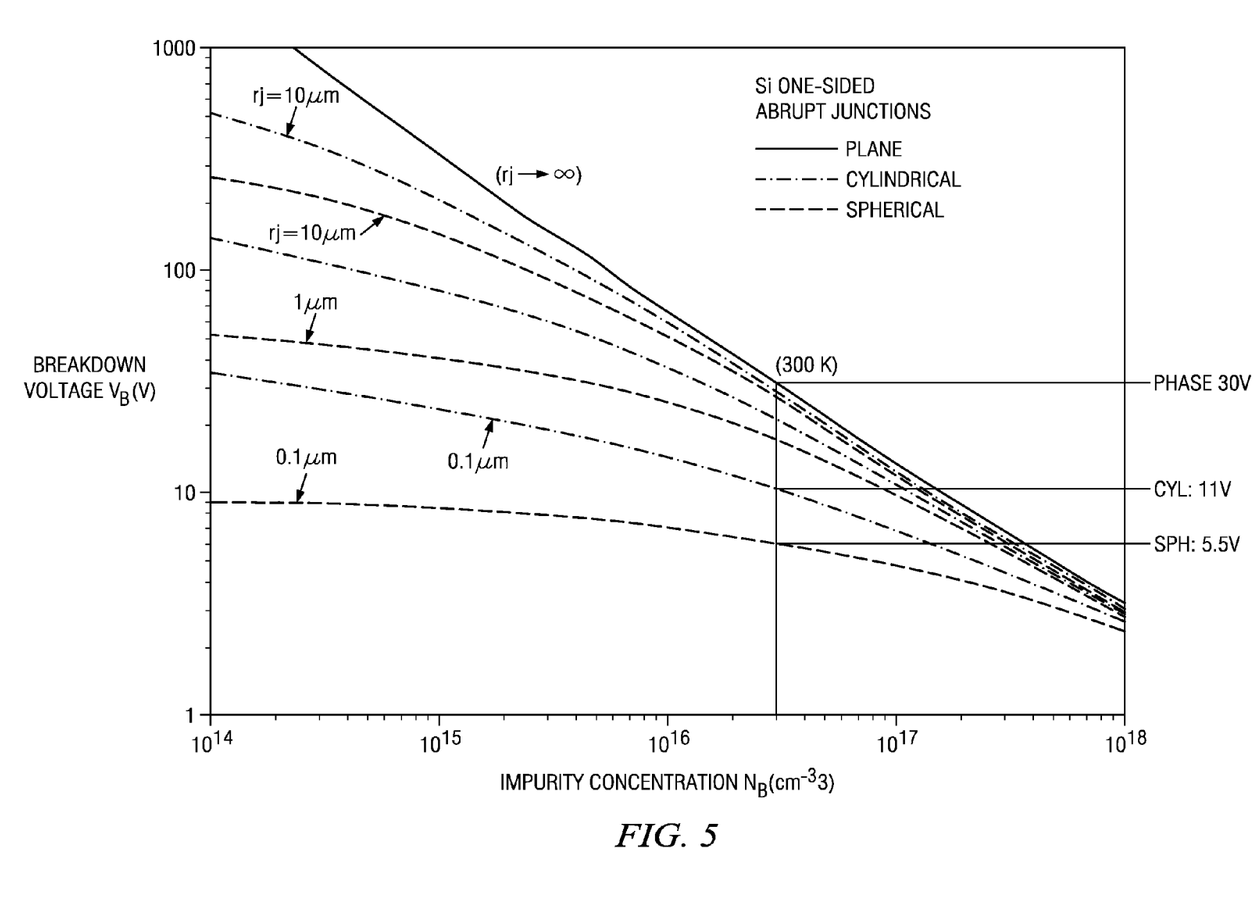
FIG. 5 shows a diagram of break down voltages for radii and regions.

FIG. 5 shows a graph of a breakdown voltages $V_B$ (V) over impurity concentration $N_B$ (cm$^{-3}$) for 300 Kelvin and a number of different radii, $r_1=0.1$ µm, $r_2=1$ µm, $r_3=10$ µm, and $r_4=\infty$. A collector may have an impurity concentration between about $10^{16}$ and $10^{17}$. Such an impurity concentration may lead to a break down at a voltage of about 5.5 V in the spherical regions 430 and a breakdown at a voltage of about 11 V in the cylindrical regions 420. Accordingly, applying break down conditions to base well 122 having the doping profile 400, the base well 122 may short first in spherical regions 430. This can be seen at FIG. 3b at point 325.

In one embodiment transforming the spherical region 430 towards a shape of the cylindrical region 420 for a same radius may increase the break down voltage. For example, if the spherical region 430 is slightly more shaped like a cylindrical region 420 for a radius $r_1=0.1$ µm, the break down voltage may increase from 5.5 V to 6.5 V. The more the spherical region 430 is approximated to a shape of the cylindrical region 420, the more the break down voltage may move from 5.5 V towards 11 V for radius $r_1=0.1$ µm. In one embodiment the spherical region 430 may be replaced with a shape of a more cylindrical region 420. In one embodiment the spherical region 430 may be changed towards the shape of a cylindrical region 420 and may form something between a spherical region 430 and a cylindrical region 420. Approximating the region 430 with a shape of the cylindrical region 420 may increase the break down voltage from 5.5 V to 11 V depending on how much region 430 is approximating the cylindrical region.

Figure 6A:
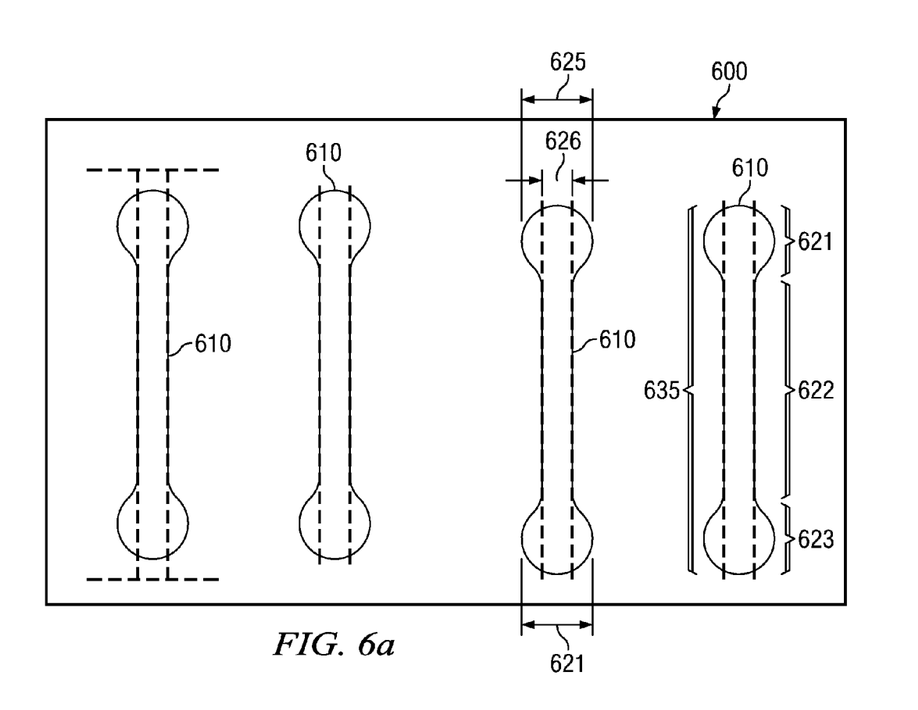
FIG. 6a shows an embodiment feature in a reticle.

FIG. 6a shows an embodiment of reticle 600 for forming a transistor region. In one embodiment the reticle 600 may be used to form a base region 122 in the transistor 200. In one embodiment the reticle 600 may be used to form an emitter region 124 in the transistor 200. In one embodiment the reticle 600 may be used to form a collector region 120 in the transistor 250. In one embodiment the reticle 600 may be used to open a material layer such as a silicon layer or a polysilicon layer. In one embodiment the reticle 600 may be applied to form collector region 120, base region 122 and emitter region 124.

The reticle 600 may comprise features 610 for forming transistor regions. The feature 610 may comprise the form of a top view of a barbell. The feature 610 may comprise a form different than a rectangle. Structuring a material layer using the reticle 600 may form a transistor region. For example, a photoresist may be formed on a material layer. The photoresist is structured applying reticle 600 and conventional lithography processes. Parts of the photoresist are removed forming openings. The openings may have the shape of the feature 610. The openings in the photoresist may be used to structure an underlying material layer or to dope the material layer or other layers beneath the material layer.

The reticle 600 may comprise a substrate. A layer comprising chrome may be disposed on the substrate. The features 610 may be formed in the layer comprising chrome.

Figure 6B:
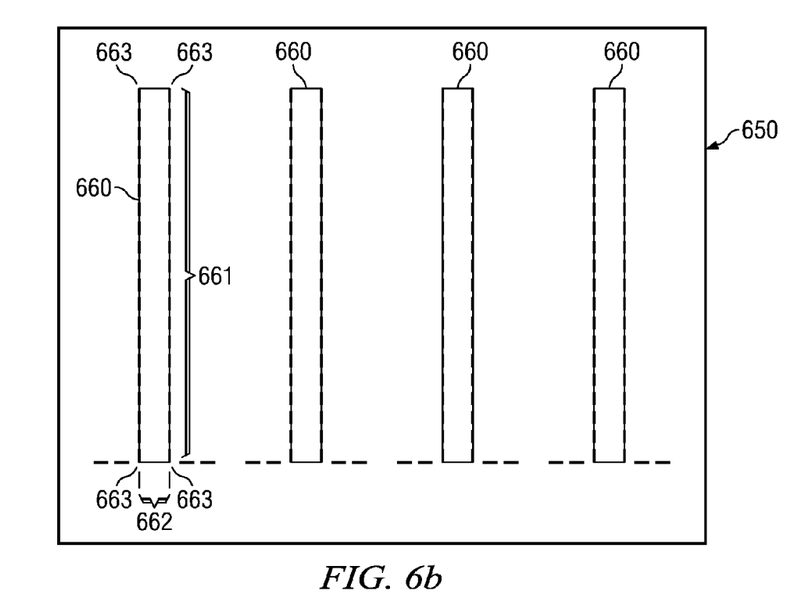
FIG. 6b shows a conventional feature in a reticle.

FIG. 6b shows a conventional reticle 650 comprising fingers 660 having a rectangle form. Each conventional finger 660 may comprise a long side 661, a short side 662 and edges 663. Using the reticle 650 as a doping mask, the long side 661 and the short side 662 may eventually form the cylindrical regions 420 in an underlying layer and the edges 663 may eventually form the spherical regions 430 in an underlying layer 120.

In one embodiment each feature 610 of reticle 600 may comprise first and second end regions 621, 623 and an inner region 622. The first and second end regions 621, 623 of the feature 610 may comprise wider widths 625, 627 than the width 626 of the inner region 622 of the feature 610. The widths 625, 627 of the end regions 621, 623 may be increased relative to the width 626 of the inner region 622. The first end width 625 may be substantially the same as the second end width 627.

The widths 625, 627 in the end regions 621, 623 of the feature 610 may be increased to avoid edges 663 of reticle 650 in the reticle 600. Avoiding edges 663 may avoid spherical regions 430 in an underlying layer. Avoiding spherical regions 430 may increase the break down voltage of the resulting transistor 200, 150. Increasing the widths 625, 627 in the end regions 621, 623 may create a more cylindrical region in the material layer/substrate where it is most likely that a voltage break down may occur in the resulting transistor 200, 150. A voltage break down may still occur in the spherical/cylindrical regions of the transistor 200, 150 formed by feature 610 but the break down voltage may be increased.

Increasing the widths of the end regions 621, 623 of the feature 610 may create a cylindrically approximated spherical (spherical/cylindrical) region in an underlying layer. The larger the widths 625, 627 in the end regions 621, 623, the more cylindrical the spherical region may become. The larger the width 625, 627 of the end regions 621, 623, the more the spherical region may approximate a cylindrical region.

In one embodiment the width 626 in the inner region 622 may be about 500 nm or less and the widths 625, 627 at the first and second end regions 621, 623 may be about 1000 nm less. In one embodiment the ratio between the width 626 of the inner region 622 and the width of the first/second 625, 627 end regions 621, 623 is about 1 to about 2.

In one embodiment the product of the length of the long side 661 and the width of the short side 662 may define the area of the conventional finger 660. The area of the conventional finger 660 may be substantially the same as the area of structure 610. The length 635 of the structure 610 may be shorter than the length of the long side 651 of conventional finger 650. The width 626 of the inner region 622 may be substantially the same as the width of the short side 653 of the conventional finger 650.

Figure 7A:
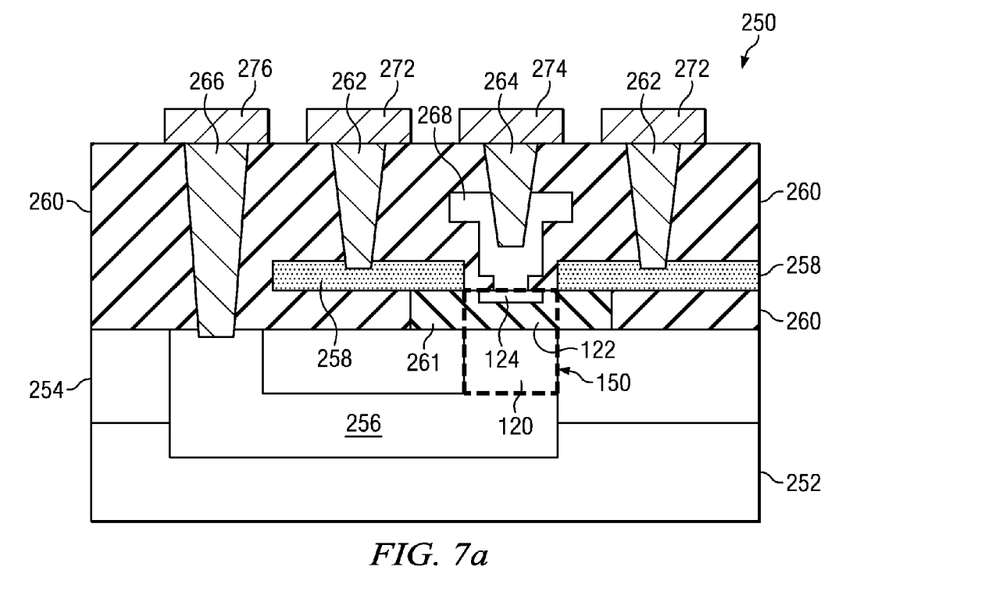
FIG. 7a shows an embodiment of a bipolar transistor.

FIG. 7a shows a cross sectional view of an embodiment of a transistor 250. The transistor 250 may comprise an inner transistor 150. The inner transistor 150 may comprise an emitter 124, a base 122 and a collector 120. For example, for an NPN transistor the collector 120 may comprise n doped silicon. The base 122 may comprise p doped silicon, silicon germanium, or silicon germanium doped carbon. The emitter 124 may comprise n doped silicon, silicon germanium, or silicon germanium with carbon. For a PNP transistor the doping structure may be opposite to that of the NPN transistor.

The inner transistor 150 may be connected to the terminals 272-276. For example, the collector 120 may be connected to the terminal 276 via a buried layer 256 and contact 266. The base 122 may be connected to the terminals 272 via extensions 258 and contacts 262. The emitter 124 may be connected to the terminal 274 via the extension 268 and contact 264.

The transistor 250 may be formed by forming an epitaxial layer 254 on a substrate 252. A collector 120 may be formed in the epitaxial layer 254 by selectively implanting dopants of a first conductivity type, for example. The substrate 252 may be silicon, gallium arsenide (GaAs) or indium phosphorous (InP).

A material layer 261 is arranged over the epitaxial layer 254. The material layer 261 may include the base 122 and the emitter 124 of the inner transistor. An extension 258 may be arranged above the material layer 261. The extensions 258 may be a highly doped polysilicon providing dopants for the base 122 and connecting the base 122 to the contacts 262. The extension 268 may be arranged above the material layer 261. The extension 268 may be a highly doped polysilicon providing dopants for the emitter 124 and connecting the emitter 124 to the contact 264. The contacts 262-266 may comprise a conductive material such as tungsten (W). An isolation layer 260 may isolate the different connections.

FIG. 7a may show a simplified isolation layer 260. The isolation layer 260 may be a plurality of layers. The contacts 262-266 may be an arrangement of contact metal lines. Terminals 272-276 may be formed on the isolation layer 260. The terminals 272-276 may be physically connected to the contacts 262-266, respectively.

Figure 7B:
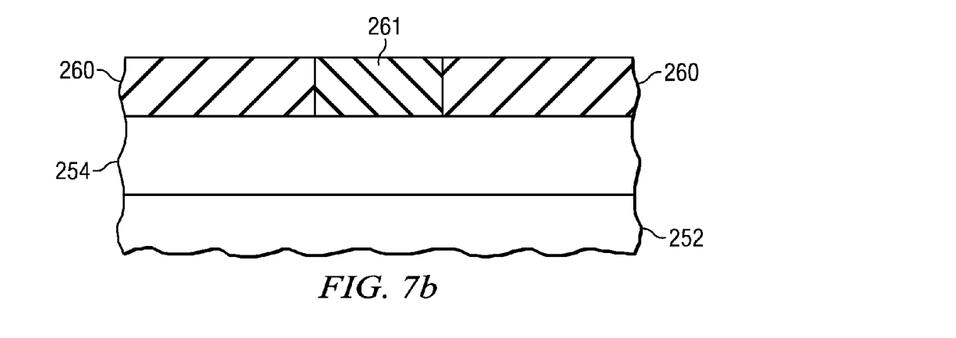
FIGS. 7b-7e show cross sectional views of a bipolar transistor in different stages of manufacturing.

FIGS. 7b-7f show a method for manufacture an embodiment of the inner transistor 150. FIG. 7b shows an isolation layer 260 formed on the epitaxial layer 254 which in turn is formed on the substrate 252. The isolation layer 260 may comprise silicon dioxide, silicon nitride or a low-k dielectric. The isolation layer 260 may be removed from an area creating an opening. A material layer 261 may be formed in the opening. The material layer 261 may comprise silicon, silicon germanium or silicon germanium with carbon.

In another embodiment a material layer 261 may be formed over the epitaxial layer 254. The material layer 261 may be removed from some areas. An isolation layer 260 may be formed on the areas from where the material layer 261 was removed.

Figure 7C:
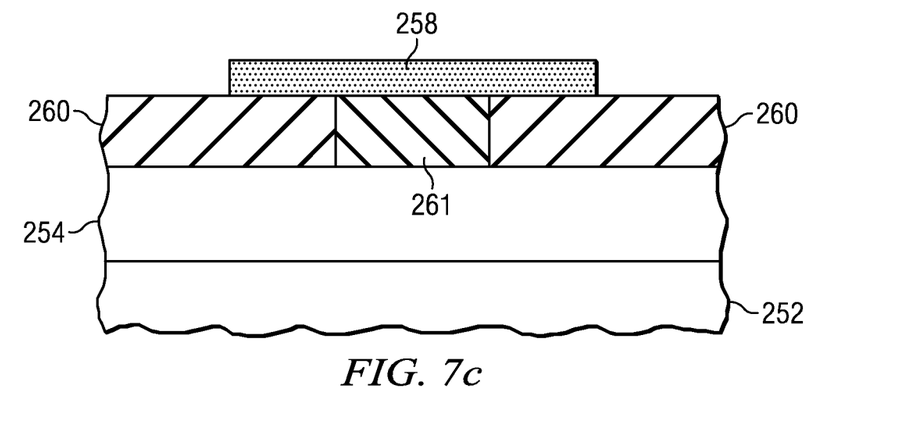

A polysilicon layer 258 may be formed on the material layer 261 and the isolation layer 260. The polysilicon layer 258 may be highly doped with dopants of a second conductivity type. The polysilicon layer 258 may be deposited selectively. This is shown in FIG. 7c.

Figure 7D:
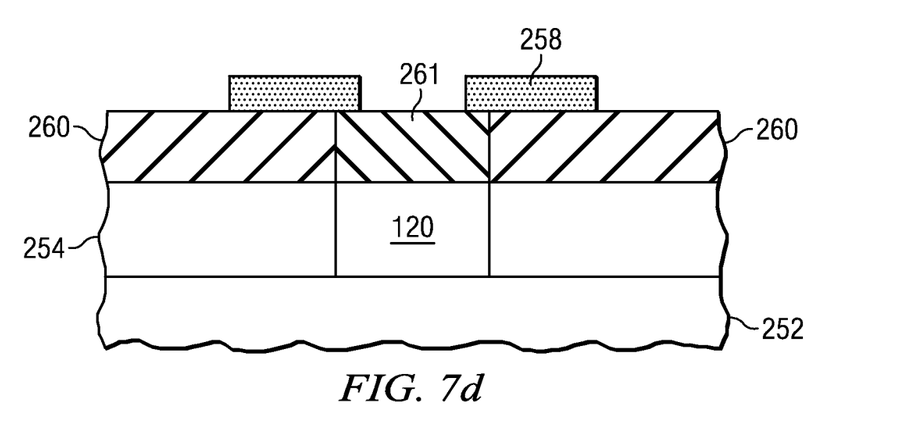

Referring now to FIG. 7d, an opening 255 may be formed in the polysilicon layer 258 and the collector 120 may be formed using the mask 600. The opening 255 in the polysilicon layer 258 may comprise the shape of the feature 610. The collector 120 may be formed by deeply implanting dopants of a first conductivity type into the epitaxial layer 254 through the opening 255. After an annealing step, the collector 120 may comprise a doping profile having only cylindrical regions, spherical/cylindrical regions and plane regions. The collector 120 may comprise a doping profile having cylindrical regions and spherical/cylindrical regions but no pure spherical regions.

In a later process step the polysilicon layer 258 may be annealed and the dopants of the second conductivity type may diffuse into the material layer 261 forming the base 122. The base 122 may comprise a profile having only cylindrical regions, spherical/cylindrical regions and plane regions. The base 122 may comprise a profile having cylindrical regions and spherical/cylindrical regions but no pure spherical regions.

Figure 7E:
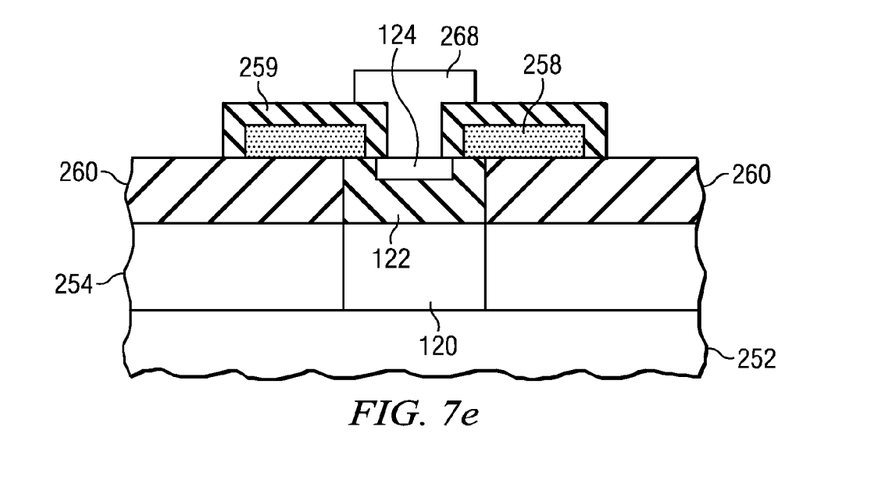

Referring now to FIG. 7e, an isolation layer 259 may be formed over the polysilicon layer 258. A second polysilicon layer 268 may be formed in the opening. The second polysilicon layer 268 may be highly doped with dopants of a first conductivity type. In a later process step the second polysilicon layer 268 may be annealed and the dopants may diffuse into the material layer 261 forming the emitter 124. The emitter 124 may comprise a profile having only cylindrical regions, spherical/cylindrical regions and plane regions. The emitter 124 may comprise a profile having cylindrical regions and spherical/cylindrical regions but no pure spherical regions.

Figures 7F, 8:
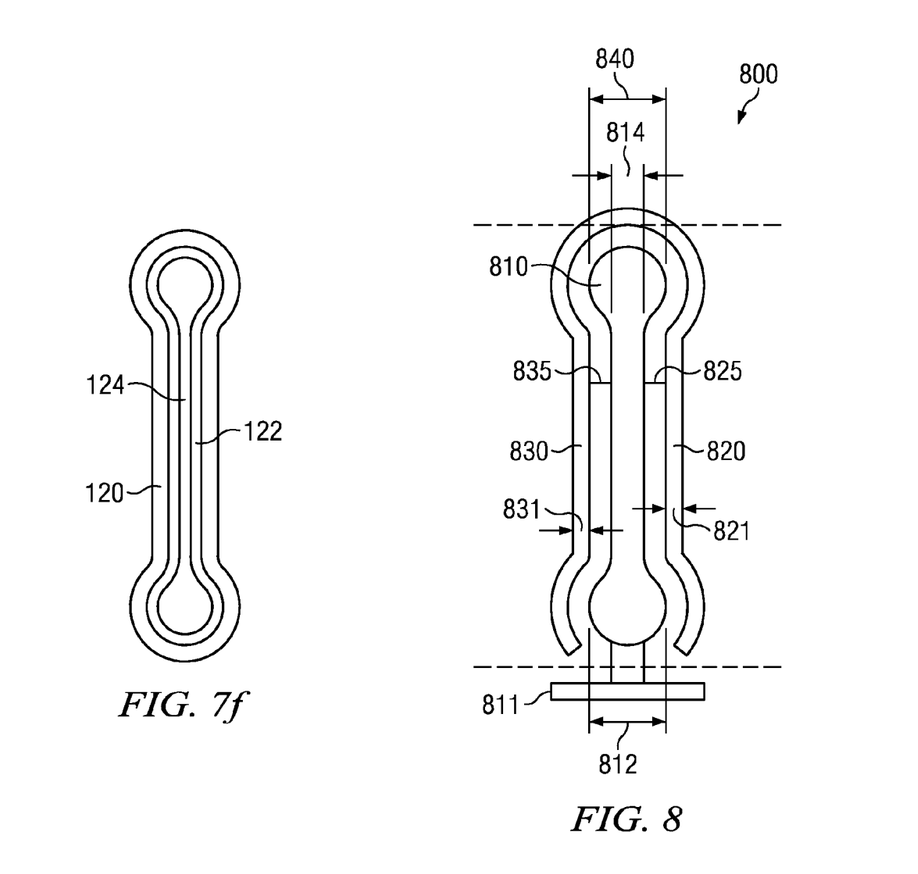
FIG. 7f shows a top view of an embodiment of a collector, base and emitter arrangement.
FIG. 8 shows an arrangement of terminals.

FIG. 7f shows a top view of an embodiment of the transistor 150. The transistor 150 may comprise a collector region 120, a base region 122 and an emitter region 124. All regions may comprise a shape of feature 610. The shape of the emitter region 124 may be smaller than the shape of the base region 122 and the shape of the base region 122 may be smaller than the shape of the collector region 120. All regions 120-124 may have the same shape but different region widths.

In one embodiment a series of reticles 600 may be applied to a material layer to form several regions having the shape of feature 610. For example, a base 122 may be made applying a first feature 610 of a first reticle 600 and an emitter 124 may be made applying a second feature 610 of a second reticle. The widths of the first and second features 610 may be different. For example, the width 625-627 for the first feature 610 of the first reticle may be wider than a width 625-627 for the second feature 610 of the second reticle 600. The shape of the first and the second feature 610 may be the same or may be different.

A first photoresist may be formed on a material layer. The first photoresist is structured and opened applying a first mask 600. The first openings may have a shape of first feature 610. Dopants of a first conductivity type may be implanted using the first openings of the first photoresist. The first photoresist may be removed from the material layer. As second photoresist may be formed on the material layer. The second photoresist is structures and opened applying a second mask 600. The second openings may have a shape of second feature 610. Dopants of a second conductivity type may be implanted using the second openings of the second photoresist. The second features 610 may be smaller than the first features 610.

FIG. 8 shows an embodiment of a top view of an arrangement of terminals 800. The arrangement of terminals 800 may comprise the terminals 222, 224, 272, 276, for example. The arrangement of terminals may comprise an emitter finger 810 and two base fingers 820, 830. The first base finger 820 and the second base finger 830 may contour the outer shape of the finger 810 or, alternatively may not contour the outer shape of the finger 810. The first base finger 820 and the second base finger 830 may have a same shape or a different shape. In one embodiment FIG. 8 shows a first distance 825 between the emitter finger 810 and the first base finger 820 and a second distance 835 between the emitter finger 810 and the second base finger 830. The first distance 825 may be substantially the same than the second distance 835.

A width of a first end region 840 of the emitter finger 810 may be larger than the width of an inner region 841 of the emitter finger 810. A width of a second end region 842 of the emitter finger 810 may be larger than the width of an inner region 841 of the emitter finger 810. The width of the first end region 840 and the width of the second end region 842 may be the same. In one embodiment the emitter finger 810 may comprise the shape of a top view of a barbell. There may be a plurality of emitter fingers 810 which may be electrically connected through connection 811. Two base fingers 820, 830 may surround each emitter finger 810.

The shape of the first base finger 820 may be substantially the same as the shape of the second base finger 830. In one embodiment a first width 821 of the first base finger 820 may be substantially the same as the second width 831 of the second base finger 830.

In one embodiment a contact may comprise the shape of feature 810. For example, emitter contact 264, 214 may comprise the shape of feature 810. In one embodiment base contacts 212, 262 may comprise the form of contact 321.

Although the present invention and its advantages have been described in detail, it should be understood that various changes, substitutions and alterations can be made herein without departing from the spirit and scope of the invention as defined by the appended claims. For example, many of the features and functions discussed above can be implemented in a capacitor manufacturing process having a lower electrode, a dielectric and an upper electrode. As another example, it will be readily understood by those skilled in the art that the novel process steps may be applied to any structure which has two conductive layers next to one another and that the process steps may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a transistor, the method comprising:

forming a semiconductive material layer over a substrate;

forming a first photoresist over the semiconductive material layer, the first photoresist comprising a first barbell shaped opening; and forming a first region by implanting dopants from a first conductivity type into the semiconductive material through the opening removing the first photoresist;

forming a second photoresist, the second photoresist comprising a second barbell shaped opening; and forming a second region by implanting dopants from a second conductivity type into the semiconductive material through the opening, the dopants from the second conductivity type being different than the dopants from the first conductivity type.

2. The method according to claim 1, wherein the dopants from the second conductivity type are n-type dopants and dopants from the first conductivity type are p-type dopants.

3. The method according to claim 1, wherein the dopants from the second conductivity type are p-type dopants and dopants from the first conductivity type are n-type dopants.

4. The method according to claim 1, wherein forming the semiconductive material comprises epitaxially forming silicon over the substrate.

5. The method according to claim 1, wherein the second region is embedded in the first region.

6. The method according to claim 5, wherein the second region is an emitter region and the first region is a base region.

7. The method according to claim 6, further comprising forming a collector region in the semiconductive material layer.

8. The method according to claim 7, wherein forming the collector region comprises forming the collector region directly adjacent the base region.

9. The method according to claim 8, wherein the base region is directly adjacent the emitter region.

10. A method for manufacturing a semiconductor device, the method comprising:

forming a collector region in a first semiconductive material;

forming a base region in a second semiconductive material over the first semiconductive material; and forming an emitter region in the second semiconductive material adjacent the base region, wherein the base region comprises a first end region width and an inner region width, wherein the first end region width is wider than the inner region width, wherein the emitter region is embedded in the base region and wherein the base region is arranged directly on the collector region.

11. The method according to claim 10, wherein the base region comprises a second end region width, and wherein the second end region width is wider than the inner region width.

12. The method according to claim 10, wherein forming the base region comprises applying an implantation mask having barbell shaped opening.

13. The method according to claim 10, wherein manufacturing the semiconductor device comprises forming a radio frequency transistor.

14. The method according to claim 10, wherein forming the second semiconductive material comprises:

forming an insulating material over the first semiconductive material;

patterning the insulating material;

forming an opening in the insulating material, the opening being on the collector region;

filling the second semiconductive material in the opening; and doping the second semiconductive material in the opening using an implantation mask having a barbell shaped opening.

15. The method according to claim 10, wherein forming the second semiconductive material comprises:

forming the second semiconductive material over the first semiconductive material;

patterning the second semiconductive material;

removing the second semiconductive material in areas other than on the collector region;

filling an insulating material in the areas; and doping the second semiconductive material using an implantation mask having a barbell shaped opening.

16. A method for manufacturing a semiconductor device, the method comprising:

forming a first semiconductive material over a substrate;

forming a second semiconductive material over the first semiconductive material;

forming an opening in the second semiconductive material, the opening comprising a barbell shape; and implanting dopants into the first semiconductive material using the opening, wherein implanting the dopants comprises implanting the dopants for a collector region of a transistor.

17. The method according to claim 16, wherein the second semiconductive material comprises a polysilicon being highly doped with dopants.

18. The method according to claim 16, further comprising forming a third semiconductive material between the first and the second semiconductive materials.

19. The method according to claim 18, further comprising annealing the second semiconductive material to form a base region of a transistor in the third semiconductive material, wherein the base region comprises a barbell shape.

20. A method for manufacturing a semiconductor device, the method comprising:

forming a collector region in a first semiconductive material;

forming a base region in a second semiconductive material over the first semiconductive material wherein forming the base region comprises applying an implantation mask having a barbell shaped opening; and forming an emitter region in the second semiconductive material adjacent the base region, wherein the base region comprises a first end region width and an inner region width, and wherein the first end region width is wider than the inner region width.

21. A method for manufacturing a semiconductor device, the method comprising:

forming a collector region in a first semiconductive material;

forming a base region in a second semiconductive material over the first semiconductive material, wherein forming the second semiconductive material comprises:

forming an insulating material over the first semiconductive material;

patterning the insulating material;

forming an opening in the insulating material, the opening being on the collector region;

filling the second semiconductive material in the opening; and doping the second semiconductive material in the opening using an implantation mask having a barbell shaped opening; and forming an emitter region in the second semiconductive material adjacent the base region, wherein the base region comprises a first end region width and an inner region width, and wherein the first end region width is wider than the inner region width.

22. A method for manufacturing a semiconductor device, the method comprising:
   forming a collector region in a first semiconductive material;
   forming a base region in a second semiconductive material over the first semiconductive material, wherein forming the second semiconductive material comprises:
      forming the second semiconductive material over the first semiconductive material;
      patterning the second semiconductive material;
      removing the second semiconductive material in areas other than on the collector region;
      filling an insulating material in the areas; and
      doping the second semiconductive material using an implantation mask having a barbell shaped opening; and
   forming an emitter region in the second semiconductive material adjacent the base region, wherein the base region comprises a first end region width and an inner region width, and wherein the first end region width is wider than the inner region width.

23. A method for manufacturing a semiconductor device, the method comprising:
   forming a first semiconductive material over a substrate;
   forming a second semiconductive material over the first semiconductive material;
   forming an opening in the second semiconductive material, the opening comprising a barbell shape;
   implanting dopants into the first semiconductive material using the opening; and
   forming a third semiconductive material between the first and the second semiconductive materials.

24. The method according to claim 23, further comprising annealing the second semiconductive material to form a base region of a transistor in the third semiconductive material, wherein the base region comprises a barbell shape.

* * * * *